(12) United States Patent
Chang et al.

(10) Patent No.: US 11,038,014 B2
(45) Date of Patent: Jun. 15, 2021

(54) SEMICONDUCTOR DEVICE HAVING PLUG AND METAL LINE

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Fu-Che Lee, Taichung (TW); Yi-Ching Chang, Pingtung County (TW); Kai-Lou Huang, New Taipei (TW); Ying-Chih Lin, Tainan (TW); Gang-Yi Lin, Taitung County (TW)

(73) Assignees: UNITED MICROELECTRONICS CORP., Hsin-Chu (TW); Fujian Jinhua Integrated Circuit Co., Ltd., Quanzhou (CN)

(*) Notice: Subject to any disclaimer, the term of this patent is extended or adjusted under 35 U.S.C. 154(b) by 0 days.

(21) Appl. No.: 16/154,704

(22) Filed: Oct. 8, 2018

(65) Prior Publication Data
US 2020/0083325 A1 Mar. 12, 2020

(30) Foreign Application Priority Data
Sep. 10, 2018 (CN) .......................... 201811049497.0

(51) Int. Cl.
*H01L 29/76* (2006.01)
*H01L 29/06* (2006.01)
(Continued)

(52) U.S. Cl.
CPC ...... *H01L 29/0649* (2013.01); *H01L 21/0274* (2013.01); *H01L 21/0337* (2013.01);
(Continued)

(58) Field of Classification Search
None
See application file for complete search history.

(56) References Cited

U.S. PATENT DOCUMENTS

| 6,661,048 B2* | 12/2003 | Yamanaka | H01L 23/535 257/296 |
| 6,690,053 B2* | 2/2004 | Amo | H01L 27/105 257/306 |
| 2018/0138041 A1 | 5/2018 | Kim | |

OTHER PUBLICATIONS

Chang, Title of Invention: Patterning Method, U.S. Appl. No. 16/003,058, filed Jun. 7, 2018.
(Continued)

*Primary Examiner* — Hung K Vu
(74) *Attorney, Agent, or Firm* — Winston Hsu

(57) ABSTRACT

A semiconductor device and a method of forming the same, the semiconductor device includes a substrate, a gate structure, a first dielectric layer, a second dielectric layer, a first plug and two metal lines. The substrate has a shallow trench isolation and an active area, and the gate structure is disposed on the substrate to cover a boundary between the active area and the shallow trench isolation. The first dielectric layer is disposed on the substrate, to cover the gate structure, and the first plug is disposed in the first dielectric layer to directly in contact with a conductive layer of the gate structure and the active area. The second dielectric layer is disposed on the first dielectric layer, with the first plug and the gate being entirely covered by the first dielectric layer and the second dielectric layer. The two metal lines are disposed in the second dielectric layer.

7 Claims, 9 Drawing Sheets

(51) Int. Cl.
 *H01L 21/027* (2006.01)
 *H01L 29/66* (2006.01)
 *H01L 21/3213* (2006.01)
 *H01L 21/033* (2006.01)
 *H01L 21/311* (2006.01)

(52) U.S. Cl.
 CPC .... *H01L 21/0338* (2013.01); *H01L 21/31111* (2013.01); *H01L 21/32133* (2013.01); *H01L 21/32139* (2013.01); *H01L 29/66545* (2013.01); *H01L 29/66795* (2013.01)

(56) References Cited

OTHER PUBLICATIONS

Chang, Title of Invention: Method of Fabricating Patterned Structure , U.S. Appl. No. 16/118,446, filed Aug. 31, 2018.
Chang, Title of Invention: Patterning Method , U.S. Appl. No. 15/641,235, filed Jul. 4, 2017.
Chang, Title of Invention: Method of Forming Semiconductor Device, U.S. Appl. No. 15/660,967, filed Jul. 27, 2017.

\* cited by examiner

US 11,038,014 B2

SEMICONDUCTOR DEVICE HAVING PLUG AND METAL LINE

BACKGROUND OF THE INVENTION

1. Field of the Invention

The present invention relates to a semiconductor device and a method of forming a semiconductor device, and more particularly to a semiconductor device being formed through a multiple patterning process and a method of forming the same.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purpose, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a semiconductor device and a method of forming the same, in which a multiple patterning process such as a self-aligned double patterning (SADP) process is utilized to form tiny structures with different pitches, dimensions and shapes in different regions according to the requirements of practical products. That is, a smaller, more densely packed semiconductor structure may be formed under a simplified process flow by using a reduced number of photomasks, to provide particular layout due to various requirements of semiconductor products.

To achieve the purpose described above, the present invention provides a semiconductor device including a substrate, a gate structure, a first dielectric layer, a second dielectric layer, a first plug and two metal lines. The substrate has a shallow trench isolation and an active area disposed therein, and a gate structure is disposed on the substrate to cover a boundary between the active area and the shallow trench isolation. The first dielectric layer is disposed on the substrate to cover the gate structure. The first plug is disposed in the first dielectric layer to directly in contact with a conductive layer of the gate structure and the active area. The second dielectric layer is disposed on the first dielectric layer, wherein the first plug and the gate structure are entirely covered by the first dielectric layer and the second dielectric layer. The metal lines are disposed in the second dielectric layer.

To achieve the purpose described above, the present invention provides a method of forming a semiconductor device including the following steps. Firstly, a substrate is provided, and the substrate has a shallow trench isolation and an active area. Then, a target layer is formed on the substrate, and a mask layer is formed on the target layer, with the mask layer having a trench in a cross-rectangular shape. Next, a first photoresist layer is formed on the mask layer, with the first photoresist layer including a plurality of first patterns being paralleled extended along a first direction, and with the first patterns being partially overlapped with the trench. Finally, the target layer is patterned through the first photoresist layer and the mask layer, to form a plurality of first target patterns and a plurality of second target patterns, wherein the second target patterns are symmetric with each other and have a relative greater pitch than that of the first target patterns.

In summary, the forming method of the present invention utilizes a multiple patterning process such as a self-aligned double patterning (SADP) process to form tiny structures within various regions of the semiconductor device. The forming method for example carries out two SADP processes in one region to form target patterns in array arrangement and finer, more densely layout, corresponding to conductive structures underneath. While performing the two SADP processes, other target patterns with different pitches, dimensions and shapes is formed in another region, with those target patterns with different pitches, dimensions and shapes being not corresponding to the conductive structures underneath. That is, the forming method of the present invention not only can form target patterns with different pitches, dimensions, shapes, and arrangements indifferent regions via the same forming processes, but also makes the target patterns formed within the same region to further obtain various pitches, dimensions and shapes, so as to meet the practical requirements of products. In this way, the forming method of the present invention enables to form the semiconductor device having particular layouts in particular regions, under a simplified process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 12 are schematic diagrams illustrating a method of forming a semiconductor device according to a preferred embodiment of the present invention, in which:

FIG. 1 shows a top view of a semiconductor device after forming a photoresist structure;

FIG. 2 shows a cross-sectional view of a semiconductor device after forming a photoresist structure;

FIG. 3 shows a cross-sectional view of a semiconductor device after forming a spacer;

FIG. 4 shows a top view of a semiconductor device after performing a self-aligned double patterning process;

FIG. 5 shows a cross-sectional view of a semiconductor device after performing a self-aligned double patterning process;

FIG. 6 shows a top view of a semiconductor device after forming another photoresist structure;

FIG. 7 shows a cross-sectional view of a semiconductor device after performing another self-aligned double patterning process;

FIG. 8 shows a top view of a semiconductor device after forming another photoresist structure;

FIG. 9 shows a cross-sectional view of a semiconductor device after forming another photoresist structure;

FIG. 10 shows a top view of a semiconductor device after forming performing an etching process;

FIG. 11 shows a cross-sectional view of a semiconductor device after performing an etching process; and FIG. 12 shows a cross-sectional view of a semiconductor device after forming target patterns.

FIG. 13 to FIG. 15 are schematic diagrams illustrating a practical example of a method of forming a semiconductor device according to the present invention, in which:

FIG. 13 shows a top view of a periphery region of a semiconductor device;

FIG. 14 shows a cross-sectional view take along a cross line C-C' in FIG. 13; and FIG. 15 shows a cross-sectional view take along a cross line D-D' in FIG. 13.

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 12, which are schematic diagrams illustrating a forming process of a semiconductor device according to the preferred embodiment of the present invention, wherein FIGS. 1, 4, 6, 7, 8 and 10 respectively show a top view of a semiconductor device during the forming process, and other figures respectively show a cross-sectional view taken along cross lines A-A' and B-B' in FIGS. 1, 4, 6, 7, 8 and 10.

Figure 1:
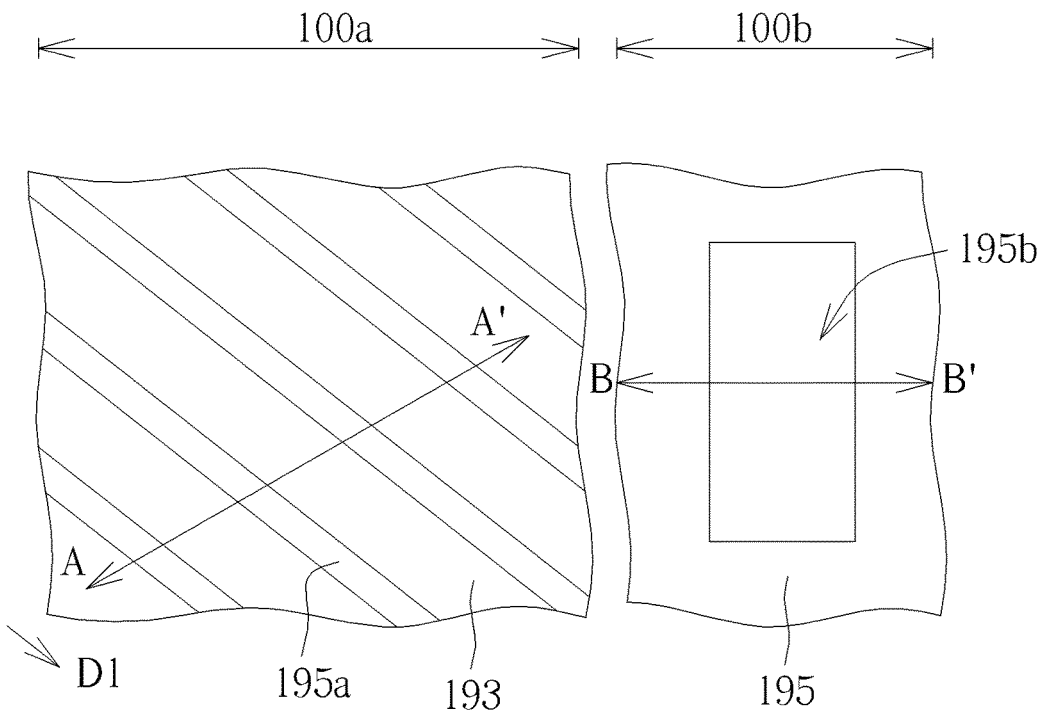

First of all, a substrate 100 is provided, for example a semiconductor substrate like a silicon substrate, a silicon containing substrate, an epitaxial silicon substrate or a silicon-on-insulator (SOI) substrate, and a first region 100*a* such as a core region of the semiconductor device, and a second region 100*b* such as a periphery region of the semiconductor device, are defined on the substrate 100, as shown in FIG. 1. In one embodiment, while the semiconductor device includes a semiconductor memory device, the first region 100*a* may be a memory region.

Figure 2:
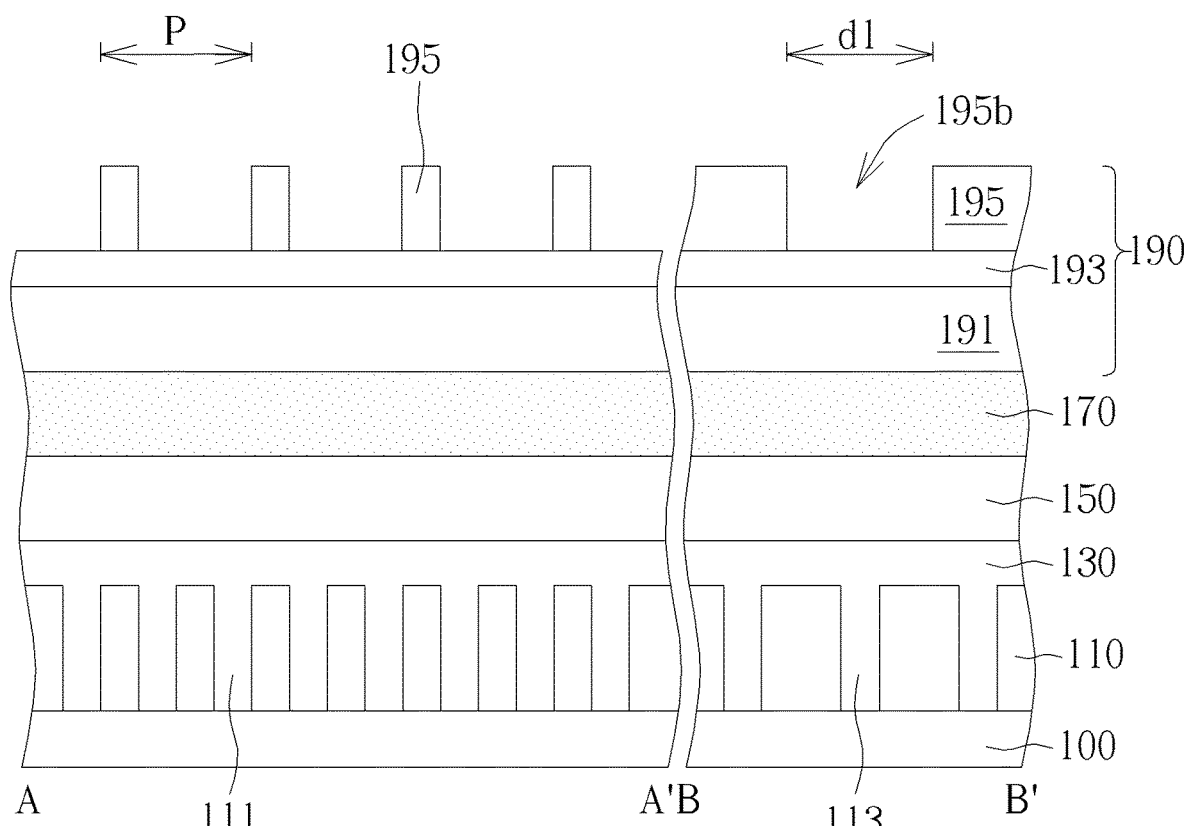

As shown in FIG. 2, a dielectric layer 110 for example including a dielectric material like silicon oxide (SiO), silicon nitride (SiN) or silicon oxynitride (SiON), a target layer 130 and other stacked layers are sequentially formed on the substrate 100. The target layer 130 namely includes a material layer to be patterned through this forming method, and which may include any suitable materials. In the present embodiment, the target layer 130 preferably includes a conductive layer having a metal material like tungsten (W), copper (Cu) or aluminum (Al), and the target layer 130 and a plurality of conductive structures 111, 113 formed in the dielectric layer 110 may be monolithic, but not limited thereto. In another embodiment, the target layer 130 may also include a dielectric layer having a dielectric material like silicon oxide or silicon nitride.

Furthermore, the stacked layer of the present embodiment may include a hard mask layer 150 such including silicon nitride, a mask layer 170 such as including a material having etching selectivity related to the hard mask layer 150, like polysilicon or amorphous silicon, and a photoresist structure 190 stacked from bottom to top. The photoresist structure 190 may include a sacrificial layer 191 such as an organic dielectric layer (ODL), an anti-reflective layer 193 such as a dielectric anti-reflective coating (DARC) layer, and a photoresist layer 195 stacked from one over another. It is noted that, the photoresist layer 195 defines a plurality of photoresist patterns 195*a* in the first region 100*a* with each of them having the same dimension and pitch, and an opening pattern 195*b* in the second region 100*b* with the opening pattern 195*b* in alignment with one of the conductive structures 113 underneath in a projection direction (not shown in the drawings), as shown in FIGS. 1 and 2. Each of the photoresist patterns 195*a* are parallel extended along a direction D1, preferably within the same dimension and pitch P. In one embodiment, the pitch P of the photoresist patterns 195*a* is about 130 nanometers (nm) to 140 nm, and which is preferably greater than a dimension d1 of the opening pattern 195*b*, for example being about 90-100 nm, but not limited thereto.

Figure 3:
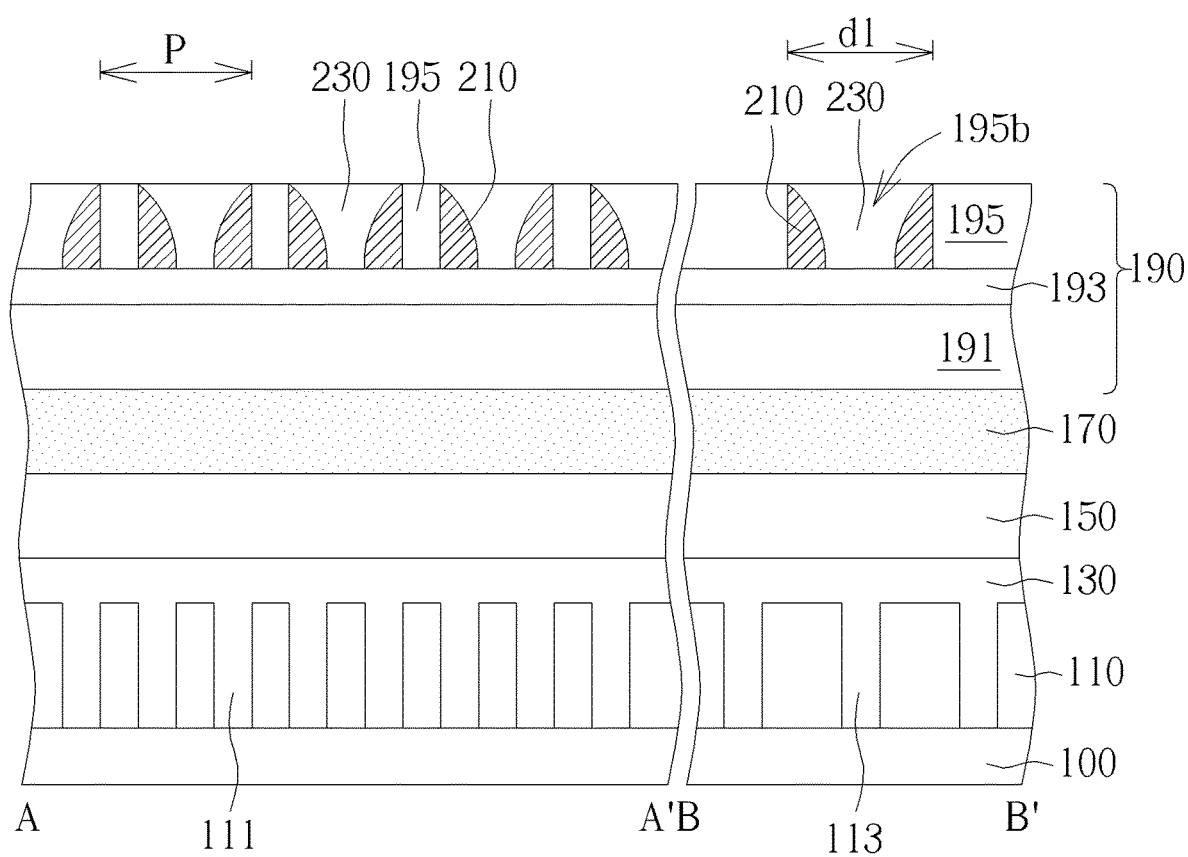
Figure 4:
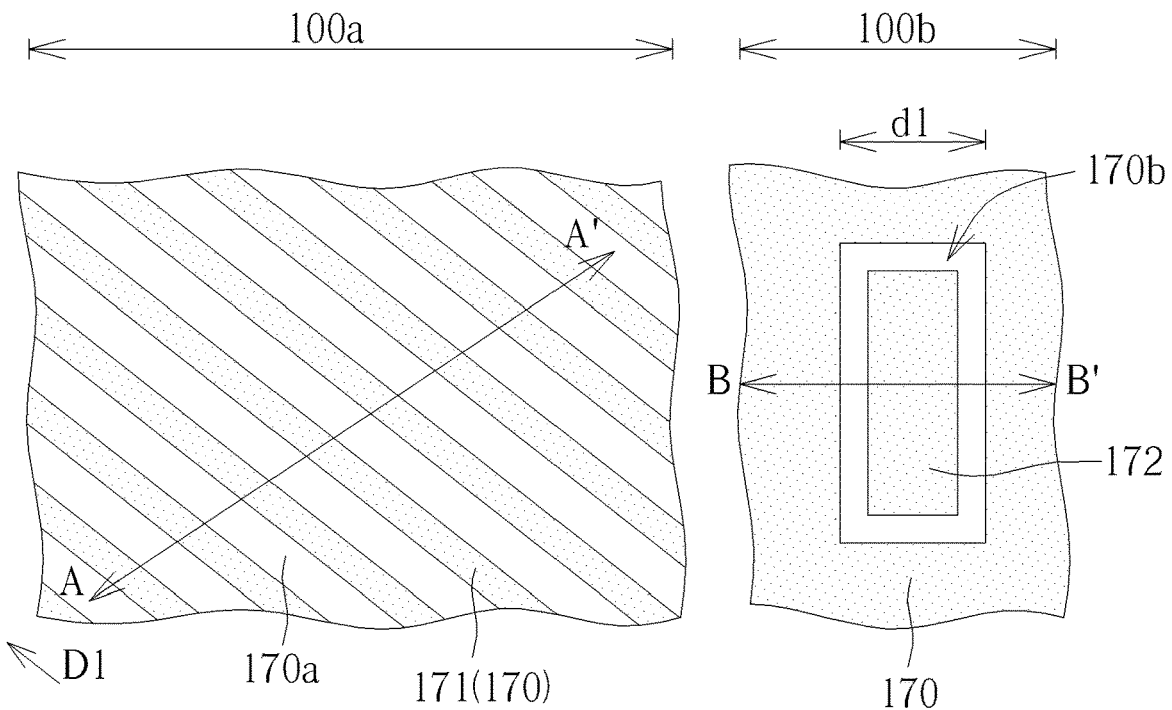
Figure 5:
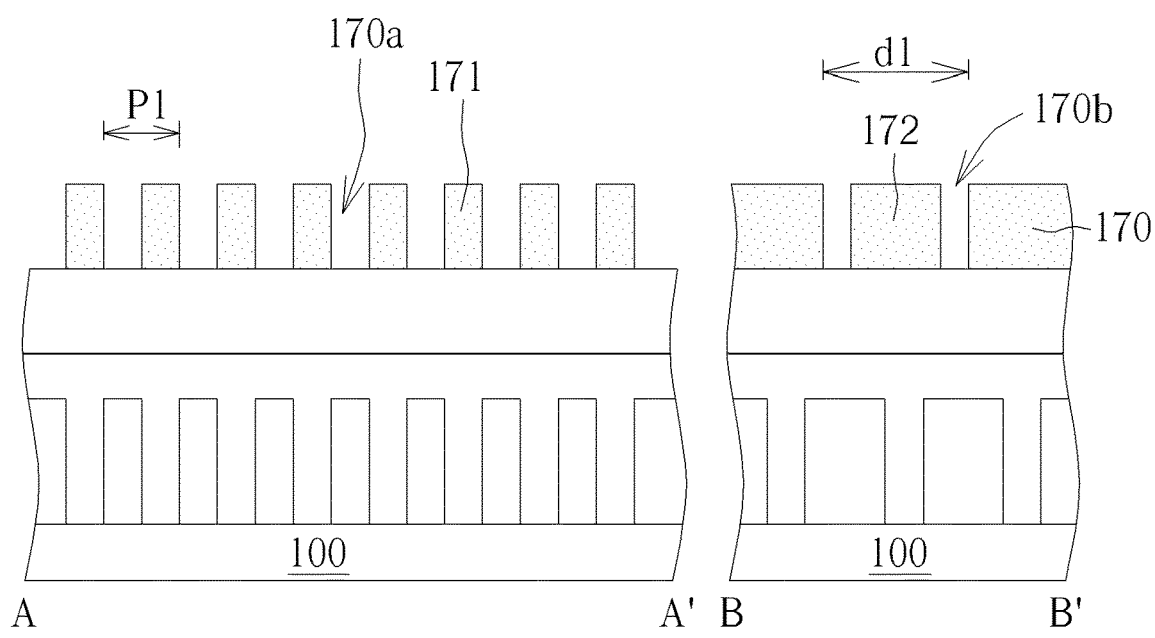

Next, a first self-aligned double patterning (SADP) process is performed to patterning the mask layer 170 underneath. According to the first SADP process, a spacer 210 is firstly formed on sidewalls of each of the photoresist patterns 195*a* and the opening pattern 195*b*, and a sacrificial layer 230 is formed to fill up the gap between each of the photoresist patterns 195*a* and the opening pattern 195*b*, as shown in FIG. 3. In one embodiment, dimensions (namely the widths) of the spacer 210 and the sacrificial layer 230 are preferably the same as the dimension of each photoresist pattern 195*a*, but not limited thereto. Then, after completely removing the spacer 210, a patterning process is performed to transfer patterns of the photoresist patterns 195*a* and the sacrificial layer 230 into the mask layer 170 underneath, to form a plurality of trenches 170*a*, 170*b* at the positions in accordance with the original formed spacers 210, as shown in FIGS. 4-5. Then, the sacrificial layer 230 and the photoresist structure 190 are completely removed. After the patterning process, the mask layer 170 within the first region 100*a* is patterned into a plurality of mask patterns 171, with each of the mask patterns 171 parallel extended along the direction D1, within a relative smaller pitch P1, for example being about half of the pitch P, as shown in FIGS. 4-5. The mask layer 170 within the second region 100*b* is patterned into a mask pattern 172 surrounding by the trench 170*b* because the trench 170*b* is formed in a cross-rectangular shape (being corresponding to the shape of the spacer 210), as shown in FIG. 4. It is noted that, an entire width of the trench 170*b* and the mask pattern 172 is the same as the dimension d1 of the aforementioned opening pattern 195*b*.

Figure 6:
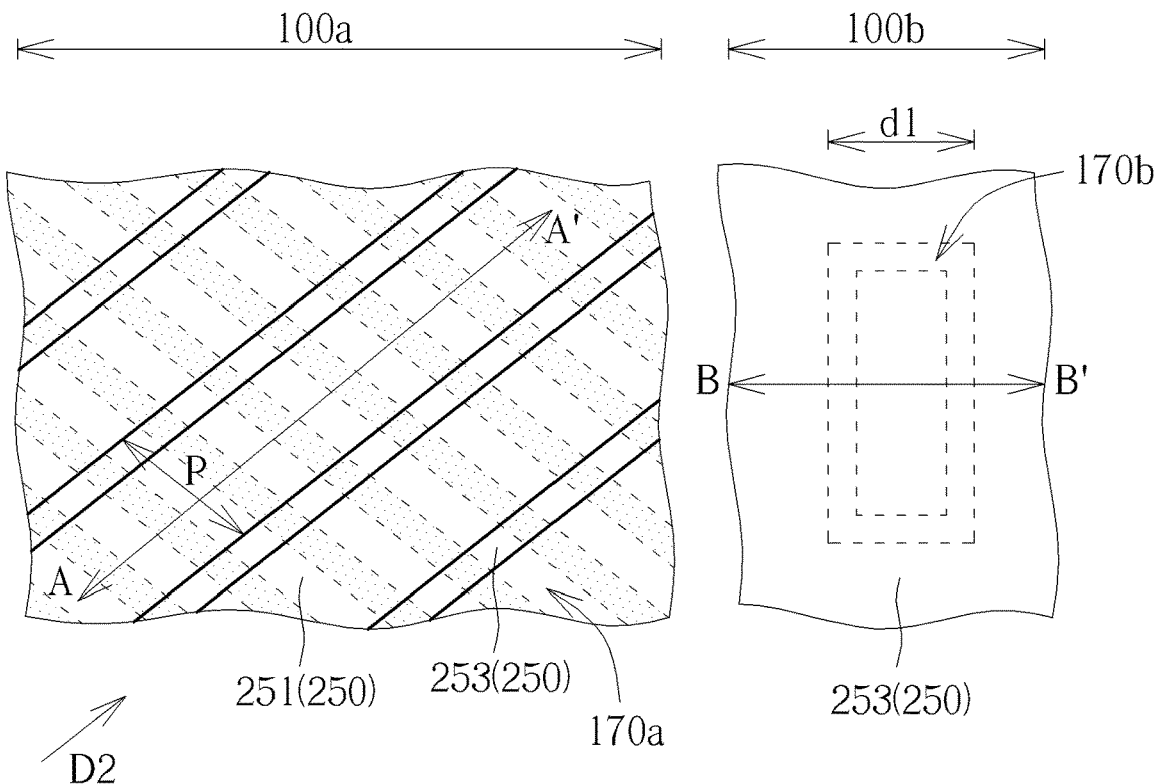
Figure 7:
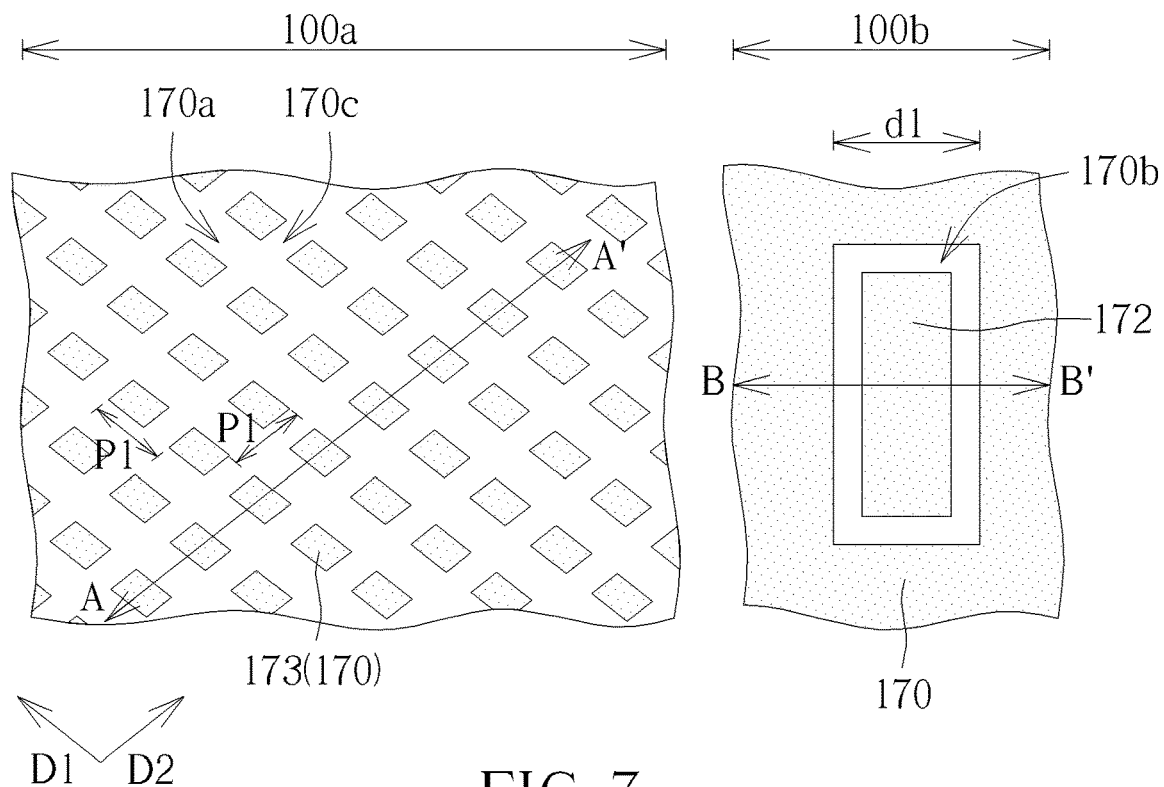

A second SADP process is then performed to further pattern the mask layer 170. Before the second SADP process, another photoresist structure 250 is formed on the mask layer 170, the another photoresist structure 250 may include a sacrificial layer (not shown in the drawings) such as an organic dielectric layer, an anti-reflective layer 251 such as a dielectric anti-reflective coating layer, and a photoresist layer 253 stacked from bottom to top. The photoresist layer 253 defines a plurality of photoresist patterns (not shown in the drawings) with each of the photoresist patterns having the same dimension and pitch, within the first region 100*a*, and entirely covers the second regions 100*b*. Each of the photoresist patterns are parallel extended along a direction D2 being different from the direction D1, (not shown in the drawings), and the dimension and the pitch of the photoresist patterns are preferably the same as the dimension and the pitch P of the photoresist patterns 195*a* as shown in FIG. 6, but not limited thereto. That is, each of the photoresist patterns and the mask patterns 171 underneath may be crossed but not perpendicular with each other, for example in an cross angle of about 60 degrees to 120 degrees, but not limited thereto. Then, similar steps as shown in FIGS. 3-5 of the first SADP process is also performed in the second SADP process, by performing another patterning process to form trenches 170c in the mask layer 170, as shown in FIG. 7. The photoresist structure 250 is completely removed after the second SADP process.

Through these performance, the mask layer 170 within the first region 100a are patterned again, to further pattern the mask patterns 171 into mask patterns 173 with a relative smaller dimension. Precisely, the mask patterns 173 are arranged in an array arrangement, and each of them are in the same and regular shape from a top view as shown in FIG. 7, such as a parallelogram shape or a diamond shape. Also, each of the mask patterns 173 has the same pitch P1 both in the directions D1, D2. On the other hand, the mask layer 170 within the second region 100b still presents the mask pattern 172 and the trench 170b surrounding the mask pattern 172 due to being entirely blocked by the photoresist structure 250 in the second SADP process.

Figure 8:
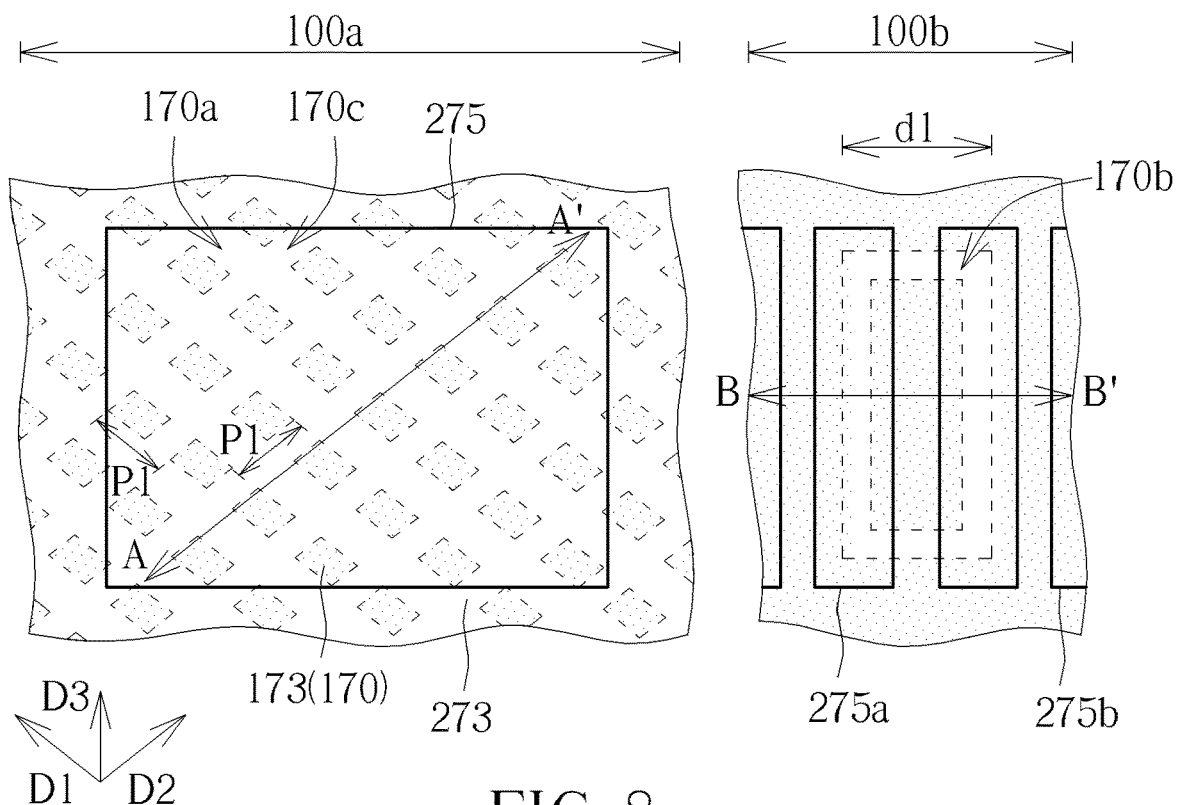
Figure 9:
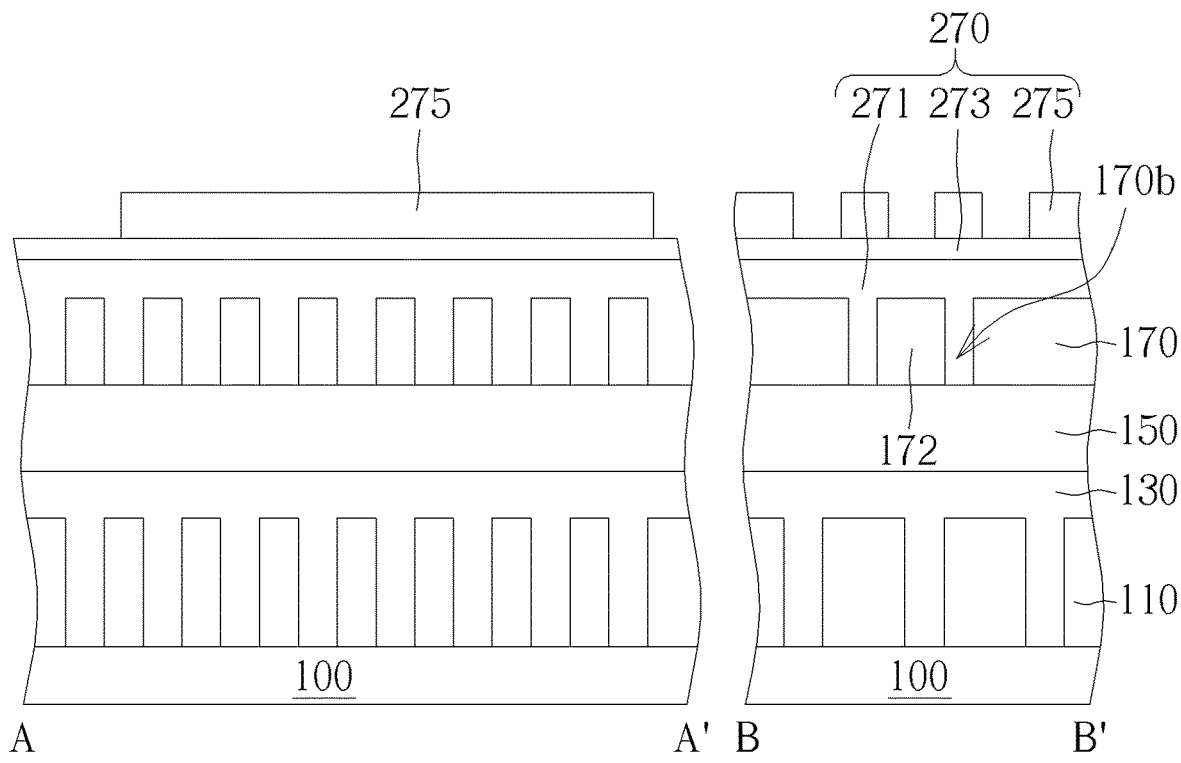

Another patterning process is then performed, to further adjust the mask patterns 173, 172 formed within the first region 100a and the second region 100b. Before performing the another patterning process, another photoresist structure 270 is formed on the mask layer 170, and which may include a sacrificial layer 271 such as an organic dielectric layer, an anti-reflective layer 273 such as a dielectric anti-reflective coating layer, and a photoresist layer 275 stacked from bottom to top. The photoresist layer 275 covers the majority of the first region 100a, particularly the center portion thereof, to expose the mask patterns 173 disposed at the periphery portion thereof, as shown in FIGS. 8-9. Also, the photoresist layer 275 defines a plurality of photoresist patterns 275a, 275b with different dimensions in the second region 100b. It is noted that, the photoresist patterns 275a, 275b are parallel extended along a direction D3 (such as the y-direction) being different from the directions D1, D2, with both of the photoresist patterns 275a, 275b having a greater length than that of the trench 170b in the direction D3, and the photoresist pattern 275a preferably has a greater dimension than the photoresist pattern 275b, for completely overlapping with two sides of the trench 170b formed in the mask layer 170, particular for the vertical portions of the cross-rectangular trench 170b. That is, the mask pattern 172 and at least a portion of the horizontal portion of the trench 170b in the mask layer 170 are exposed from the photoresist patterns 275a, 275b, as shown in FIGS. 8-9.

Figure 10:
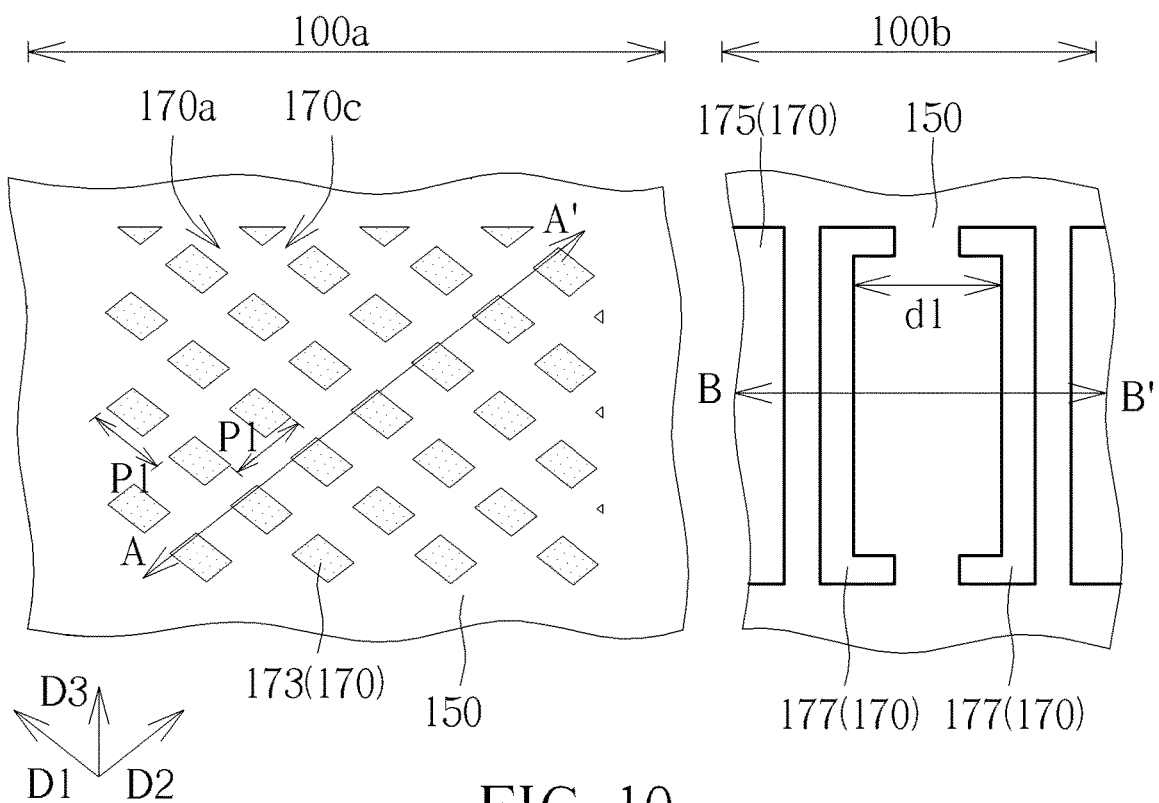
Figure 11:
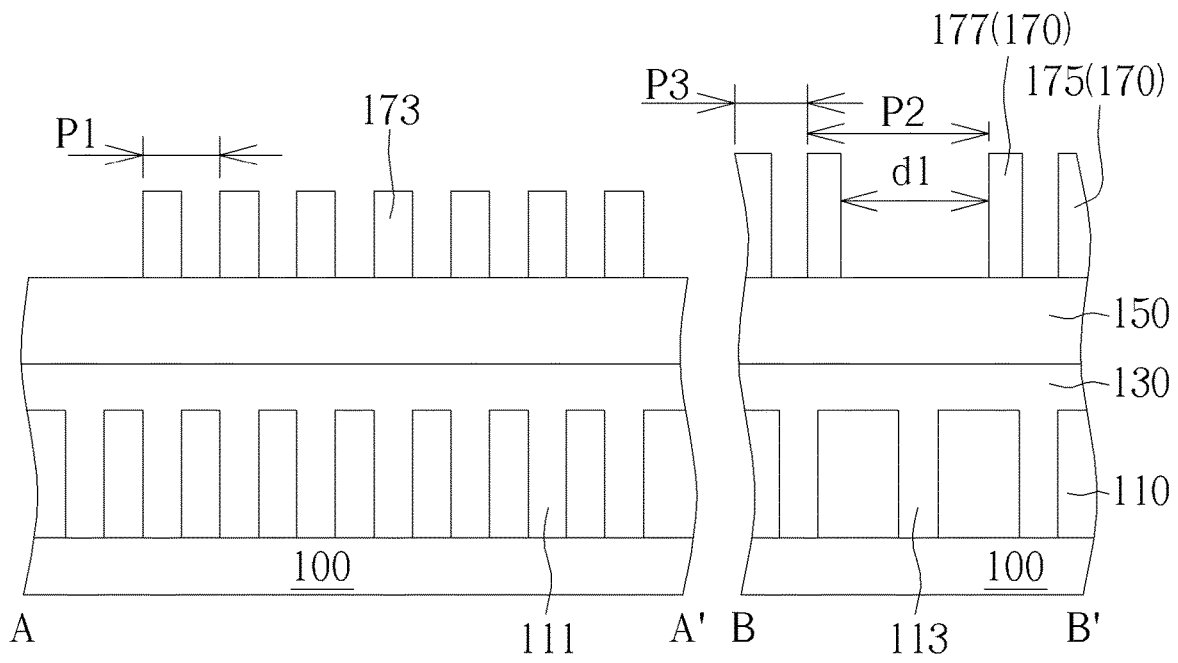

The another patterning process is performed through the photoresist structure 270, to further pattern the mask layer 170 by removing the mask patterns 173 disposed at the periphery portion of the first region 100a and only leaving the mask patterns 173 disposed at the center portion of the first region 100a, as shown in FIGS. 10-11. On the other hand, the mask pattern 172 disposed in the second region 100b is completely removed in the another patterning process, and the mask layer 170 in the second region 100b is further patterned into mask patterns 175, 177. Precisely speaking, the mask patterns 175 is formed in accordance with the photoresist patterns 275b, and the mask patterns 177 are formed in accordance with the photoresist patterns 275a. Also, since the positions of the photoresist patterns 275a are partially overlapped with the vertical portion of the cross-rectangular trench 170 underneath, a portion of each mask pattern 177 may obtain a smaller width than that of the mask patterns 175, as shown in FIG. 10. That is, the mask patterns 177 may therefore perform a square-bracket shape. Through this performance, each of the mask patterns 175, 177 may have different pitches P3, P2 therebetween, from a cross-section view as shown in FIG. 11, and a greatest distance between the two mask patterns 177 is substantially equal to the dimension d1 of the aforementioned opening pattern 195b.

Figure 12:
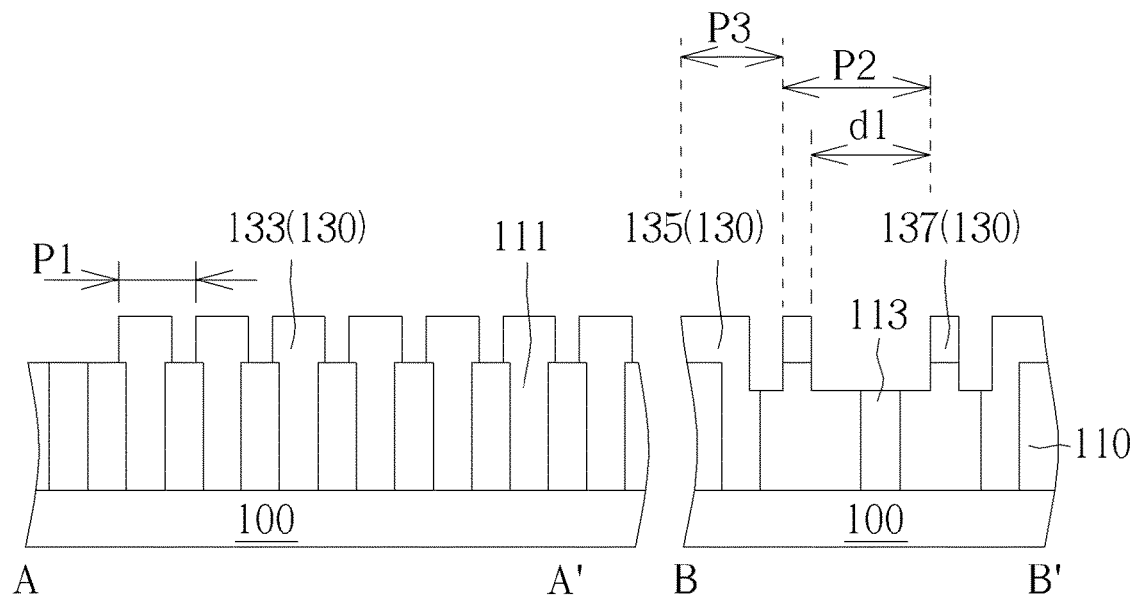

Following these, after removing the photoresist structure 270, another etching process may be performed, to pattern the hard mask layer 150 and the target layer 130 by simultaneously using the mask patterns 173 within the first region 100a and the mask patterns 175, 177 within the second region 100b as an etching mask, to form a plurality of hard mask patterns (not shown in the drawings) and a plurality of target patterns 133, 135, 137 corresponding to each mask patterns 173, 175, 177 respectively. Then, the mask layer 170 and the hard mask layer 150 are removed to obtain the structure as shown in FIG. 12.

Each of the target patterns 133 formed within the first region 100a has the same and regular shape, dimension and pitch P1 as that of the mask patterns 173, so that, the target patterns 133 are also perform like an array arrangement from a top view (not shown in the drawings). The target patterns 135,137 formed within the second region 100b are corresponding to the mask patterns 175, 177 respectively, so as to obtain the same shapes, dimensions and pitches P3, P2 thereto. Also, the two target patterns 137 have a symmetric shape, and the pitch P2 therebetween is greater than the pitch P3 between the target patterns 135. It is noted that, each of the target patterns 133, 135 formed within the first region 100a, the second region 100b are completely or partially in alignment with each of the conductive structures 111, 113 respectively in the dielectric layer 110 underneath. On the other hand, each of the target patterns 137 formed within the second region 100b are disposed at two opposite sides of one of the conductive structure 113 underneath instead of being in alignment with the conductive structure 113 underneath due to the greater distance (being substantially the same as the dimension d1 of the aforementioned opening pattern 195b) between the two target patterns 137.

In this way, the forming method of a semiconductor device according to the preferred embodiment of the present invention is completed. According to the forming method of the present embodiment, a multiple patterning process is firstly carried out to form finer structures within different regions of the semiconductor device. Firstly, two SADP processes are performed to form smaller, more densely packed target patterns 133 in an array arrangement in the first region 100a, to correspond to the conductive structures 111 underneath. Meanwhile, the target patterns 135, 137 with different shapes, dimensions and pitches P3, P2 are formed within the second region 100b during the two SADP processes, to make the patterns 137 being not in alignment with the conductive structures 113 underneath. Through there arrangement, the forming method of the present embodiment not only provides target patterns 133, 135, 137 with different pitches, dimensions, shapes and arrangements in different regions 100a, 100b via the same forming processes, but also makes the target patterns 135, 137 formed within the same region 100b to obtain various pitches, dimensions and shapes, so as to perfectly meet the practical requirements of products. Furthermore, the forming method of the present embodiment may optionally let the target patterns 135, 137 formed within the same region 100b to align or not align with the conductive structures 113 underneath, so that, it has advantages to form the semiconductor device having particular layouts in particular regions.

For example, the forming process of the present embodiment may be practical applied to a forming process of a semiconductor memory device such as a dynamic random access memory (DRAM) device, to respectively form storage node pads (SN pads) which is connected with storage node contacts (SNC), and meta lines in two different regions (such as a memory cell region and a periphery region) of the semiconductor memory device.

In one embodiment, the first region 100a may be the cell region, so that, the conductive structures 111 formed within the first regions 100a may be the SNCs of the semiconductor memory device. Moreover, a plurality of bit lines (BLs) (not shown in the drawings) is further formed in the dielectric layer 110, and the BLs and the conductive structures 111 are alternately disposed in the dielectric layer 110, with each of the BLs including a semiconductor layer (not shown in the drawings) such as a silicon layer, a barrier layer (not shown in the drawings) such as a titanium (Ti) layer or a titanium nitride (TiN) layer, a metal conductive layer (not shown in the drawings) having a low resistant metal like tungsten, aluminum or copper, and a mask layer (not shown in the drawings) such as a silicon nitride layer or a silicon carbonitride (SiCN) layer stacked from bottom to top, and with a portion of the semiconductor layer formed in the substrate 100 to form a bit line contact (BLC, not shown in the drawings) under the BL, to electrically connect to a transistor (not shown in the drawings) of the semiconductor memory device. That is, a conductive layer as the target layer 130 disposed on the dielectric layer 110 may be patterned through the aforementioned forming processes, to form the SN pads (namely, the target patterns 133) which are electrically connected to each conductive structures 111, so as to accept signals from the transistor through the SNCs during the operation.

Figure 13:
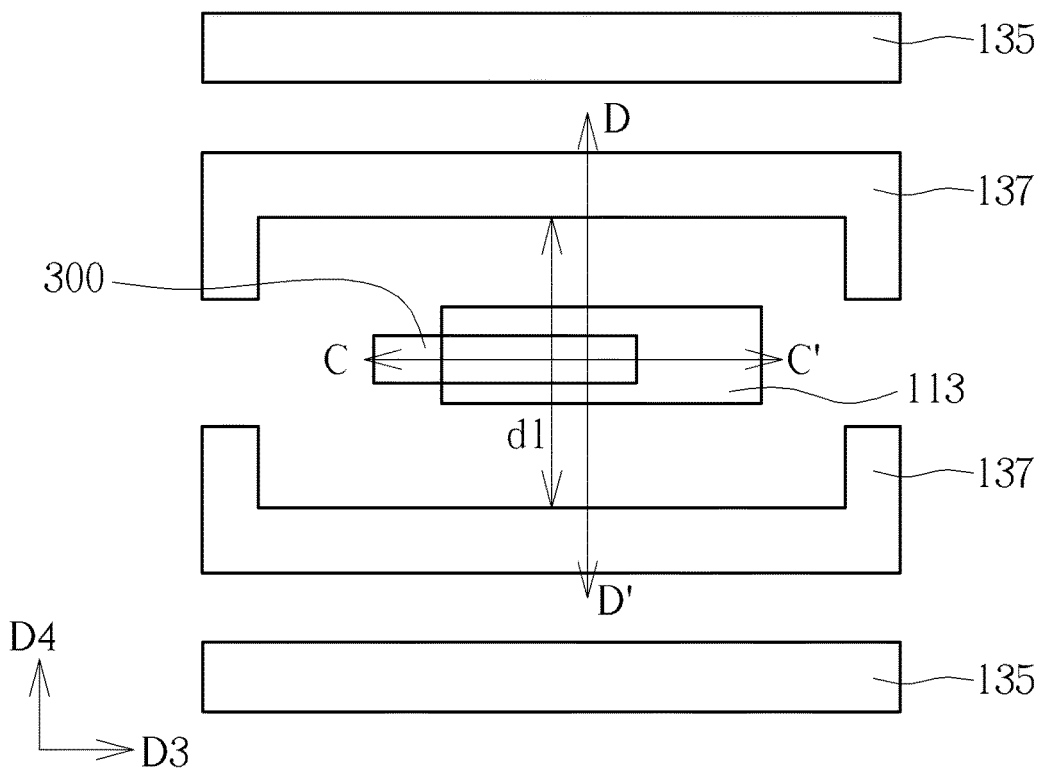
Figure 14:
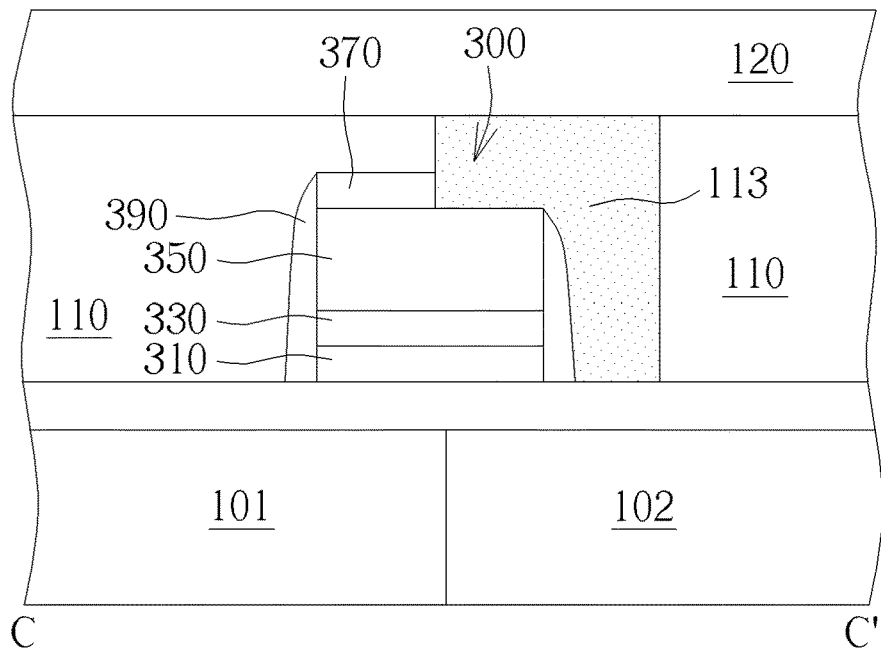
Figure 15:
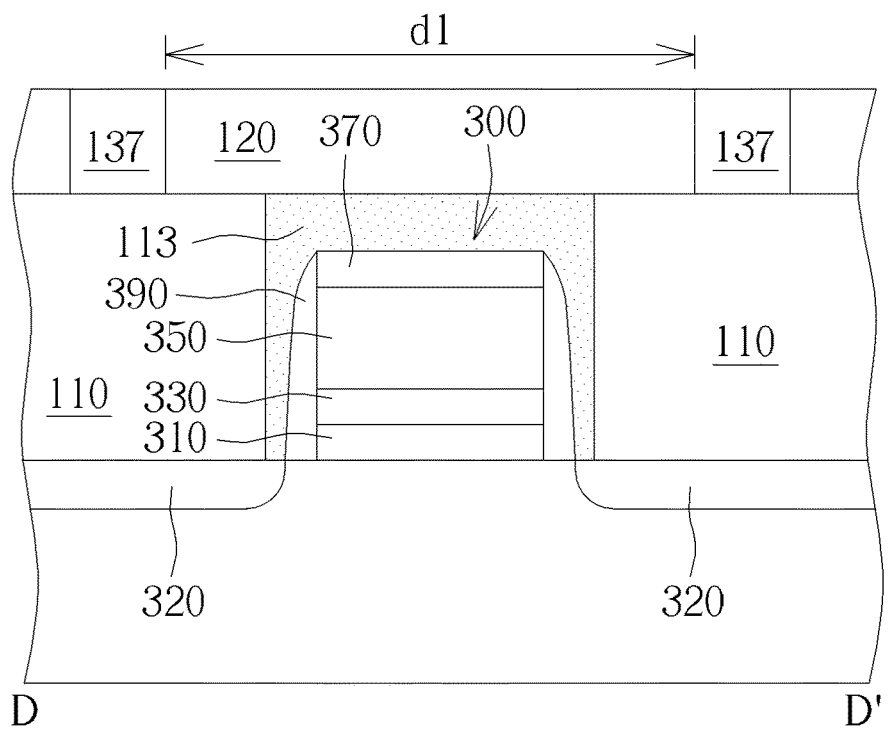

On the other hand, the second region 100b may be the periphery region, and the conductive structures 113 formed within the second region 100b may be functioned as plug structures of the semiconductor memory device to electrically connect to a gate structure 300 disposed on the substrate 100, as shown in FIGS. 13-15. Precisely speaking, while forming the BLs in the cell region (namely, the first region 100a), the gate structure 300 is simultaneously formed in the periphery region (namely, the second region 100b), for example at a boundary between an active area 102 formed in the substrate 100 and a shallow trench isolation 101 surrounding the active area 102, with the gate structure 300 including a stacked structure also including a semiconductor layer 310 such as a silicon layer, a barrier layer 330 such as a titanium layer or a titanium nitride layer, a metal conductive layer 350 having a low resistant metal like tungsten, aluminum or copper, and a mask layer 370 stacked from bottom to top. The gate structure 300 further includes a spacer 390 to surround the stacked structure, and a source/drain region 320 at two sides of the gate structure 300 in a direction D4. In the present embodiment, one of the conductive structures 113 disposed within the second region 100b at least partially covers the gate structure 300, by penetrating through a portion of the mask layer 370 and a top portion of the spacer 390 to directly contact to the metal conductive layer 350 and the substrate 100 (namely, the active area 102) at a side of the gate structure 300, as shown in FIG. 14, so that, the one of the conductive structure 113 is electrically connected to the source/drain region 320, to configured as a loop wire.

It is noted that, while forming the SN pads in the first region 100a through the aforementioned forming process, a plurality of the wires (namely, the target patterns 135, 137) are also formed in the second region 100b to electrically connect to a plurality of plugs (not shown in the drawings) formed in the second region 100b, for example the plugs (not shown in the drawings) which are electrically connected to the source/drain region 320 at two sides of the gate structure 300. However, since the gate structure 300 and conductive structure 113 electrically connected to the gate structure 300 are not necessary to be electrically connected to each wire, a greater distance such as 90-100 nm is requested to be performed between particular two wires (namely, the target patterns 137) adjacent to the gate structure 300, to avoid the possible damages to the loop due to the direct connections between each wire and the gate structure 300 and/or the conductive structure 113. In other words, the gate structure 300 and the conductive structure 113 connected thereto are further covered by another dielectric layer 120 disposed on the dielectric layer 110, and, the gate structure 300 and the conductive structure 113 are namely disposed between two wires (namely the target patterns 137) in the dielectric layer 120 in a projection direction (not shown in the drawings), being completely coved by the two dielectric layers 110, 120. That is, the two wires (namely the target patterns 137) may only contact to the dielectric layer 110 instead of contacting the gate structure 300 and the conductive structure 113 connected to the gate structure 300 in the dielectric layer 110, as shown in FIG. 15. On the other hand, other wires (namely, the target patterns 135) are required to be electrically connected to the plugs formed in the dielectric layer 110 (not shown in the drawings).

Thus, the forming process of the aforementioned embodiment enables to meet the practical requirements of products such as a semiconductor memory device, so as to form a semiconductor device with a particular layout under a simplify process. However, people skilled in the arts may fully understand that the forming method of the present invention is not limited to be achieved through the aforementioned process and may further include other example. For example, in some embodiments, the hard mask layer 150 may be omitted, so as to directly pattern the target layer 130 through the mask layer 170. Furthermore, the following description will detail the different embodiments of the forming method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 16:
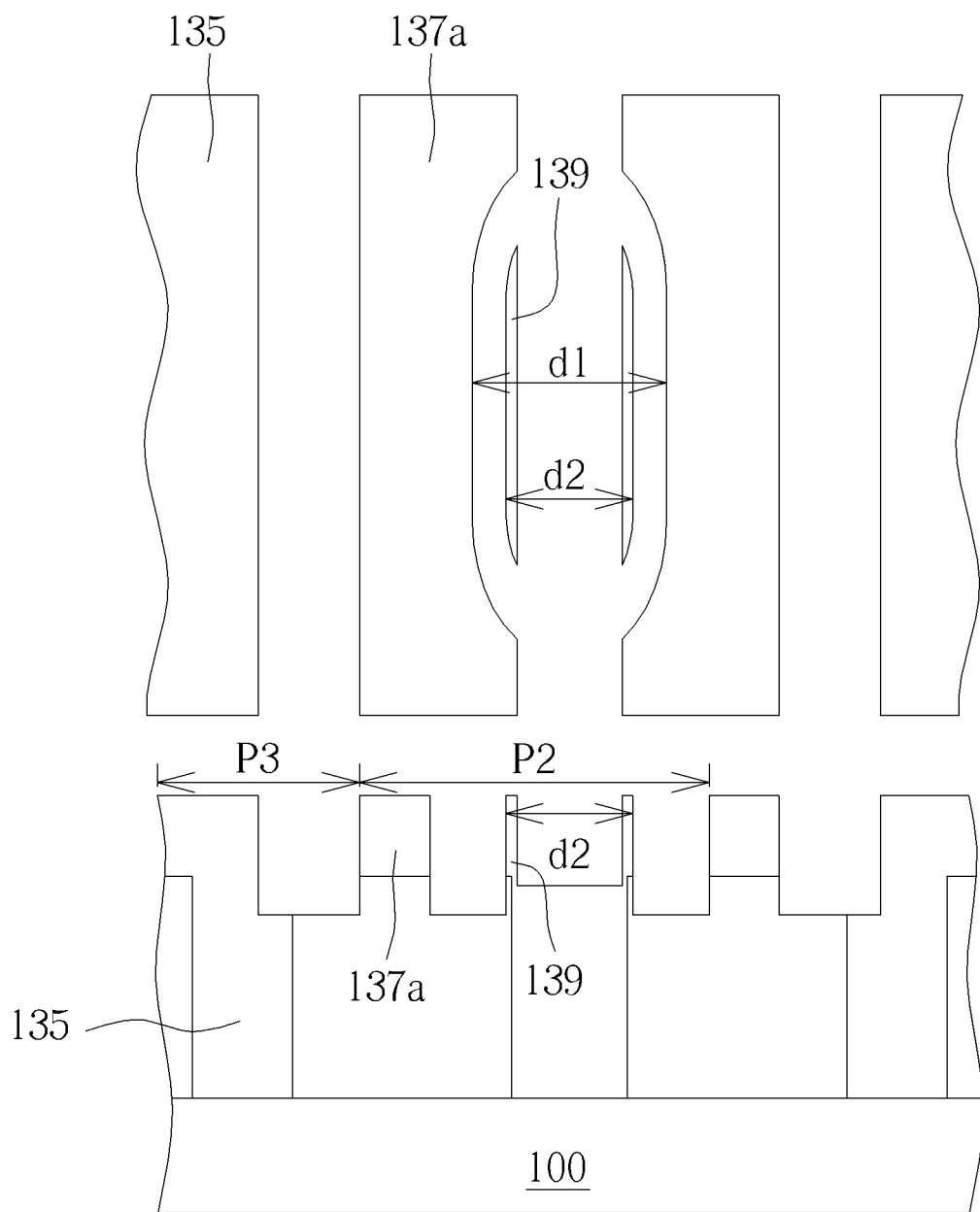
FIG. 16 shows a schematic diagram illustrating a method of forming a semiconductor device according to another preferred embodiment of the present invention.

Please refers to FIG. 16, which is a schematic diagram illustrating a forming process of a semiconductor device according to another preferred embodiment of the present invention. The formal steps in the present embodiment are similar to those in the aforementioned preferred embodiment, and which will not redundantly described herein. The differences between the present embodiment and the aforementioned embodiment are that, the shape of the target patterns 137a formed in the present embodiment. It is noted that, although the target patterns 137 formed in the aforementioned embodiment are exemplified to have a square brackets shape, but the practical shape thereof is not limited thereto. During the practical formation, the conditions of the exposure process, the development process, and the etching process may be further adjusted for rounding corners of each target pattern 137, so as to form the target patterns 137a as shown in FIG. 16, in a parentheses shape. Also, in another embodiment, the covering positions of each of the photoresist patterns 275a, 275b may be further adjusted while performing the another patterning process, to make at least a portion of the mask patterns 172 may be covered by the photoresist patterns 275a. In this way, the portion of the mask patterns 172 may also be transferred into the target layer 130 after the another patterning process and the subsequent etching process, thereby forming two target patterns 139 between the two target patterns 137a as shown in FIG. 16. The two target patterns 139 have a relative smaller dimension than other target patterns 135, 137/137a, so that, the pitch (not shown in the drawings) and a distance d2 between the two target patterns 139 are also smaller than the dimension d1 of the aforementioned opening pattern 195b.

Overall speaking, the present invention provides a forming method by using a multiple patterning process to form finer structure within different regions of a semiconductor device. The forming method of the present invention utilizes two SADP processes to form smaller, more densely packed target patterns in an array arrangement in one region, and also to form other target patterns with different shapes, dimensions and pitches in another region, with these other target patterns being not in alignment with the conductive structures underneath optionally. Through there arrangement, the forming method of the present embodiment not only provides the target patterns with different pitches, dimensions, shapes and arrangements in different regions via the same forming processes, but also makes the target patterns formed within the same region to further obtain various pitches, dimensions and shapes, so as to meet the practical requirements of products. In this way, the forming method of the present invention enables to form the semiconductor device having particular layouts in particular regions, under a simplified process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, having a shallow trench isolation and an active area disposed therein;
   a gate structure disposed on the substrate, covering a boundary between the active area and the shallow trench isolation;
   a first dielectric layer disposed on the substrate, covering the gate structure;
   a first plug disposed in the first dielectric layer, the first plug directly in contact with a conductive layer of the gate structure and the active area;
   a second dielectric layer disposed on the first dielectric layer, wherein the first plug and the gate structure are entirely covered by the first dielectric layer and the second dielectric layer; and
   two metal lines disposed in the second dielectric layer, wherein the gate structure, the first plug and the two metal lines are separately extended along a same direction, and the gate structure and the first plug are disposed between the two metal lines.

2. The semiconductor device according to claim 1, wherein the two metal lines are not directly in contact with the first plug.

3. The semiconductor device according to claim 1, wherein the gate structure comprises a spacer, and the first plug directly contacts the spacer.

4. The semiconductor device according to claim 1, wherein the substrate comprises a first region and a second region surrounding the first region, and the gate structure and the first plug are both disposed in the second region.

5. The semiconductor device according to claim 4, further comprising:
   a plurality of bit lines and a plurality of second plugs alternately disposed on the substrate, within the first region; and
   a plurality of conductive pads disposed on the second plugs, in connection to the second plugs respectively.

6. The semiconductor device according to claim 5, wherein the conductive pads and the metal lines have a same material.

7. A semiconductor device, comprising:
   a substrate, having a shallow trench isolation and an active area disposed therein;
   a gate structure disposed on the substrate, covering a boundary between the active area and the shallow trench isolation;
   a first dielectric layer disposed on the substrate, covering the gate structure;
   a first plug disposed in the first dielectric layer, the first plug directly in contact with a conductive layer of the gate structure and the active area, wherein the first plug covers two opposite sidewalls of the gate structure;
   a second dielectric layer disposed on the first dielectric layer, wherein the first plug and the gate structure are entirely covered by the first dielectric layer and the second dielectric layer; and
   two metal lines disposed in the second dielectric layer.

* * * * *